United States Patent [19]

Marshall et al.

[11] Patent Number: 4,649,821
[45] Date of Patent: Mar. 17, 1987

[54] ELECTRICAL CIRCUIT CONTINUITY TEST APPARATUS FOR FIRING UNIT

[75] Inventors: William F. Marshall, Belmont; Theodore F. Netoff, Oakland, both of Calif.

[73] Assignee: Quantic Industries, Inc., San Carlos, Calif.

[21] Appl. No.: 815,868

[22] Filed: Jan. 3, 1986

[51] Int. Cl.[4] ........................ F42C 11/00; G01R 31/02
[52] U.S. Cl. ........................................ 102/206; 324/51
[58] Field of Search .................. 102/206, 218; 324/51, 324/57 R, 60 R

[56] References Cited

U.S. PATENT DOCUMENTS 4,414,901 11/1983 Sellwood ............................ 102/206
4,559,875 12/1985 Marshall ............................. 102/206

Primary Examiner—Charles T. Jordan
Attorney, Agent, or Firm—Flehr, Hohbach, Test, Albritton and Herbert

[57] ABSTRACT

Electrical circuit continuity test apparatus for the high energy discharge circuitry of a firing unit couples to the stripline transmission line of the discharge circuitry but adds minimal inductance to the circuit. This is achieved by a coupling transformer having a core of high magnetic permeability alloy which loops around one of the strip conductors of the stripline. The primary winding, which couples into test circuit is merely another conductor wrapped around this core. The primary winding senses the reflected capacitive impedance of the discharge circuitry which includes an added capacitor to bypass the high energy switch of the discharge circuitry.

Impedance sensing is accomplished by a resistance bridge driven by an oscillator and where imbalances indicating a defective circuit are sensed by a synchronous demodulator and a window comparator.

5 Claims, 3 Drawing Figures

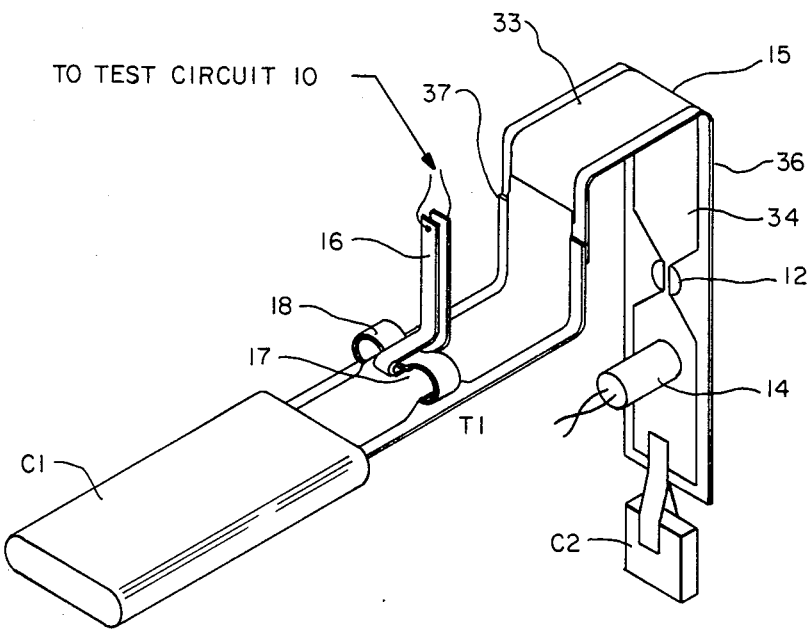
FIG.—2
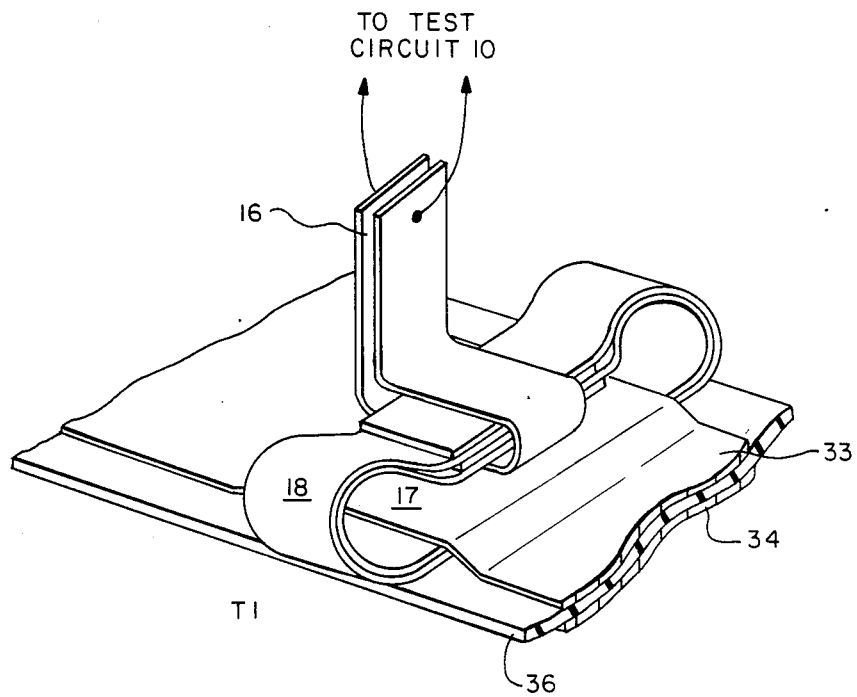
FIG.—3

ELECTRICAL CIRCUIT CONTINUITY TEST APPARATUS FOR FIRING UNIT

The present invention is directed to an electrical circuit continuity test apparatus and more specifically to test apparatus for high-energy-discharge circuitry of a firing unit.

Firing units for explosive devices, such as aerial bombs or rockets after they are mounted in the flight equipment are not readily accessible and any periodic testing must be performed via electrical interface cables. This is especially true since the firing unit outputs an explosive initiation and thus the high energy circuitry needed to initiate explosions is not accessible at the outside of the firing unit package.

If direct connection is made to the firing unit circuitry, there is a risk of compromising the integrity of the firing unit and creating a safety hazard.

OBJECT AND SUMMARY OF INVENTION

Thus, it is an object of the present invention to provide an improved electrical circuit continuity test apparatus for firing units.

In accordance with the above object, there is provided electrical circuit continuity test apparatus for high-energy-discharge circuitry of a firing unit. The unit includes a high-energy storage capacitor means connected to detonator means by a normally opened switch. The capacitor means, switch, and detonator means are all electrically interconnected by a stripline transmission line having a pair of strip conductors separated by a thin dielectric. Capacitor means bypass the normally opened switch. A test circuit includes impedance sensing means and a high frequency signal source. A transformer couples the test circuit to the stripline transmission line and includes a high permeability core in the form of a loop of high magnetic permeability material having thickness and width dimension substantially of the same order of magnitude as a strip conductor and being inserted in a crosswise manner between the strip conductor and the dielectric of the transmission line. The transformer includes primary winding means wrapped around the loop and connected to the test circuit to couple the high frequency signal source to the high energy storage capacitor means and the bypass capacitor means whereby the sensing means may sense the impedance of the capacitor means and the transmission line.

BRIEF DESCRIPTION OF DRAWINGS

FIG. 2 is a perspective view of a firing circuit which has been modified in accordance with the present invention; and FIG. 3 is an enlarged perspective view of a portion of FIG. 2.

DESCRIPTION OF PREFERRED EMBODIMENT

Figure 1:
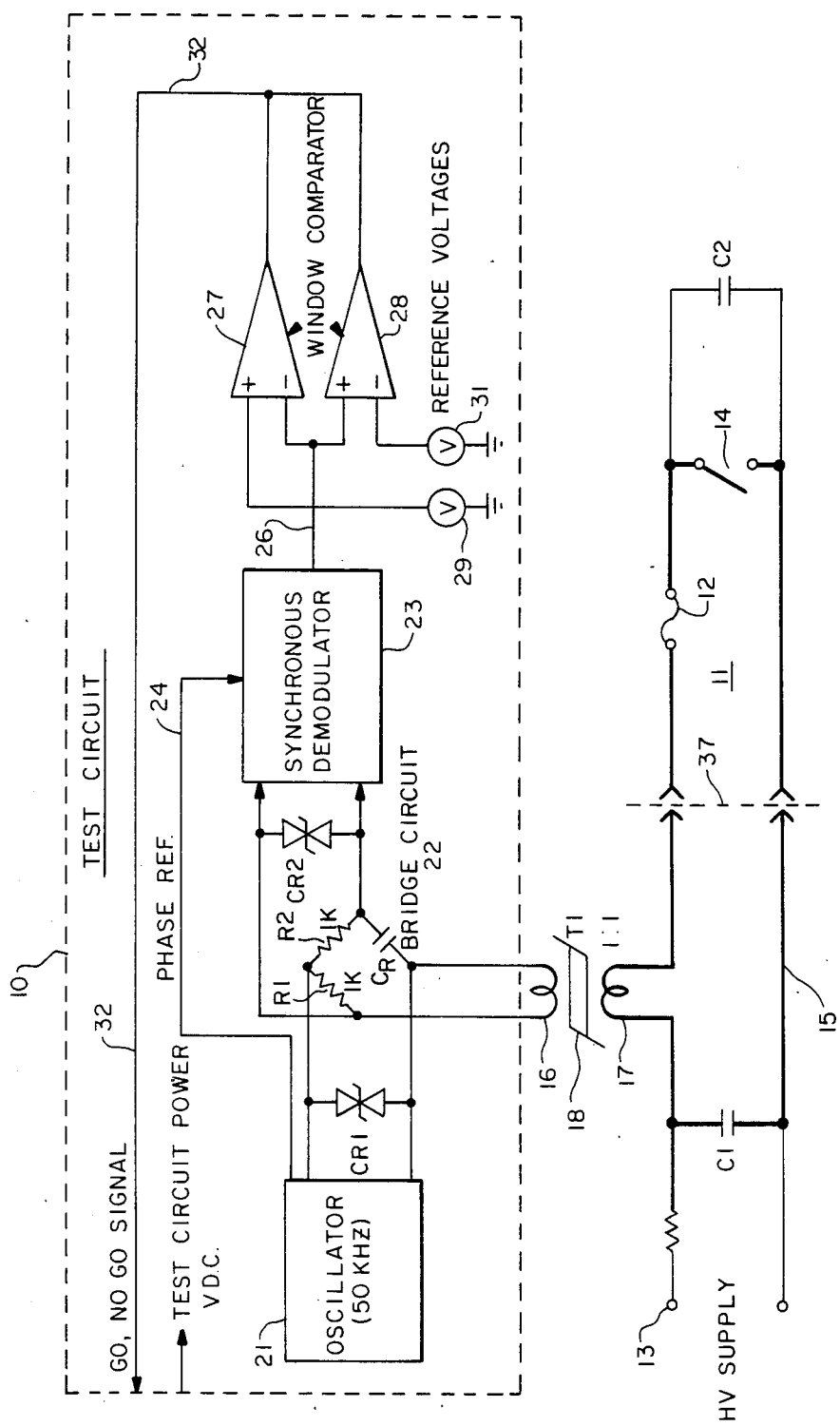
FIG. 1 is a schematic circuit of apparatus embodying the present invention.

FIG. 1 illustrates a test circuit 10 as it would be coupled to high energy discharge circuitry 11 which in turn would be an integral part of a firing unit. In fact, the discharge circuitry 11 includes a slapper detonator 12, which provides an explosive charge which initiates a high explosive unit, such as a rocket motor igniter or aerial bomb warhead. Generally, the high energy discharge circuitry has several components which includes a high energy capacitor C1, which is charged to a high voltage of, for example, 2 KV, by a high voltage supply applied to terminals 13. When this high energy capacitor C1 is charged, it has sufficient energy to fire slapper detonator 12. However, the switch 14 which is in a normally open position as indicated, prevents such detonation until the desired time.

Since the overall impedance of the discharge circuitry in order to work effectively must be very low, both the resistive impedance and inductive impedance must be minimized. This is accomplished by providing a transmission line of the stripline type 15, which interconnects the various working components of the discharge circuitry which include the capacitor C1, switch 14 and slapper detonator 12.

In accordance with the invention, in order to electrically couple the test circuit 10 to the discharge circuitry 11, there is provided a coupling transformer T1, which includes a primary winding 16 which is effectively a part of the test circuit 10, a secondary winding 17 which is part of the stripline 15 and a core 18. Test circuit 10 includes impedance sensing means and a high-frequency signal source which are coupled into the discharge circuitry 11 via transformer T1. In order that the discharge circuitry 11 appear as a complete electrical circuit, the bypass capacitor C2 is connected across the normally opened switch 14. Thus, in general the impedance of the discharge circuitry 11 will appear as a series circuit with the capacitors C1 and C2 in series with slapper detonator 12 and the interconnecting stripline 15 and will be reflected via the secondary winding 17 through transformer T1 to primary winding 16 and thus the test circuit 10. As will be described in detail below by sensing the magnitude of the impedance, the condition of the discharge circuit 11 can be determined.

Test circuit 10 includes an oscillator 21 having a frequency of, for example, 50 KHz, and which is connected across two branches of a resistance bridge 22. Specifically, bridge circuit 22 has four branches, two of which are reference resistors R1 and R2 having a nominal one kilohm impedance, the third branch being a reference capacitor $C_R$ and the last branch the primary winding 16. Connected across the other two branches is a synchronous demodulator 23 which is provided a phase reference from oscillator 21 by a line 24. Thus, the synchronous demodulator will sense out of balance impedance conditions with reference to capacitor $C_R$ and the direction of out of balance will also be indicated by the polarity of the output signal because of the phase reference input 24. This signal is outputted on a line 26 connected to the inverting and non-inverting inputs of a pair of comparators 27 and 28, which together form a window comparator. The other inputs of the comparators are suitable reference of voltages 29 and 31. The outputs of the comparators are combined to form a single line 32 which as indicated provides a go or no-go signal; in other words, it indicates whether the discharge circuitry 11 is in a workable firing condition or whether there is a short or open circuit.

To protect the test circuit 10, from the effects of high voltages on the discharge circuitry 11, back to back zener diodes CR1 are placed across the oscillator 21 output and diodes CR2 are placed across the input to synchronous demodulator 23. Synchronous demodulator 23 and the associated oscillator 21 may be purchased as an off-the-shelf integrated circuit.

The discharge circuitry 11 and its interconnection via the transformer T1 to test circuit 10, is illustrated in greater physical detail in FIG. 2. Here the high energy capacitor C1 is fairly large relative to the bypass capacitor C2, since it must store sufficient energy to actuate slapper detonator 12. Typically, the capacitor C1 might have a value of 0.1 microfarad, whereas C2 need be only 0.01 microfarad. The stripline transmission line 15 includes two thin strips 33 and 34 of copper conductors separated by a thin dielectric 36. The connection of the high energy capacitive portion C1 of the circuit with slapper detonator 12 is merely accomplished by the overlaying of the strip conductors 33 and 34 and the dielectric layer 36 as indicated by the connection 37. This is also illustrated by the dashed line in FIG. 1. Normally the strip conductors 33 and 34 are insulated from one another by dielectric 36. However, actuation of high energy switch 14 physically presses the two strip conductors together to make electrical contact to connect the high energy capacitor C1 in the circuit to fire slapper detonator 12.

Since the timing of the foregoing action must take place in a few 10's nanoseconds, it is imperative that the discharge circuitry has a very low inductance and resistive impedance. This is the reason as discussed above for the use of a stripline type transmission line 15. Thus, the transformer coupling T1 must not add perceptible inductance to the stripline high energy discharge circuit when firing the slapper detonator.

Referring to FIG. 3 which is a greatly enlarged detailed view of transformer T1, this is accomplished in part by providing a transformer core 18, which is composed of a high magnetic permeability material (for example, PERMALLOY 80) which is looped around strip conductor 33 in a crosswise direction to the general direction of the stripline. Since loop 18 is inserted between the strip conductor 33 and the dielectric layer 36, the portion 17 of strip conductor 33 actually serves as a secondary winding of the transformer T1. In order to minimize inductance, the thickness and width dimensions of core 18 are substantially the same order of magnitude as strip conductor 33. For example, strip conductor 33 may have a width of ⅜ of an inch and the width of loop 18 may ¼ of an inch. Loop 18 is actually composed of two strips of the high magnetic permeability material having, for example, a thickness of 0.0005 inches. Again this is of the same order of magnitude as strip conductor 33. As is apparent in loop 18, by the use of a pair of strips they may overlap each other to form a good magnetic coupling.

Then the primary winding 16 is another strip of copper material which is relatively thin and which thickness is of the same order of magnitude as strip conductor 33 and is wrapped once around the loop 18 in the general direction of the transmission line 15 and as indicated it is connected to test circuit 10.

Thus, the transformer T1 has a turns ratio of 1 to 1, since there is one loop of primary winding 16 around core 18 and an effective single loop 17 of strip conductor 33 around core 18. Therefore, the impedance of the discharge circuitry reflected by the transformer T1 is close to its actual value.

Core 18 is a high magnetic permeability material which is preferably an iron base alloy with a high percentage of nickel, for example, from 45% to 80%. It is sold commercially under the trademark, PERMALLOY 80. Because of the high magnetizing force and the small cross-sectional area of the iron core, the iron core saturates within the first nanoseconds of the firing of the discharge circuitry. Thus, the permeability of the transformer core will fall from its natural value of over 50,000 to 1. This is the permeability of the stripline transmission line's plastic insulation which is dielectric 34. And secondly the very thin strips of coupling material which constitutes the core 18 ensure that there is little added inductance to the stripline when the core is saturated because of the close proximity of the stripline conductors in the vicinity of the transformer.

Thus, the magnetic core of transformer T1 essentially disappears as a contributor of inductance in the stripline during the detonator firing and does not significantly impede the high energy discharge current from capacitor C1, as it is flowing to slapper detonator 12.

In operation to verify stripline circuitry continuity in accordance with the present invention, the stripline discharge circuit 11 must appear as a secondary winding with one turn that has a reflected capacitive load corresponding to capacitors C1 and C2 in series. The remaining part of the transmission line has an insignificant impedance. Such impedance is, of course, the series combination of the capacitors. Thus, assuming a 50 kilohertz oscillator frequency, capacitor C1 with a suggested value of 0.1 microfarad will have an impedance of 31.9 ohms and capacitor C2 with a value of 0.01 microfarad an impedance of 319 ohms. Their series combination is approximately 351 ohms. The reference capacitor $C_R$ of circuit 22 can thus be configured to represent this desired impedance. If the impedance is greater than this amount, there is an imbalance in the bridge circuit 22 indicating perhaps an open circuit of the high energy capacitor C1 and a no-go signal results on line 32. The reference voltages 29 and 31 will be chosen to allow for tolerance variations.

On the other hand, a short circuit which shifts the impedance in a lower direction from a capacitor standpoint, by proper adjustment of reference voltages 29 or 31, also results in a no-go signal. The synchronous demodulator 23, of course, is sensitive to the direction of the imbalance and, thus, one of the window comparators would correspond to impedances greater than desired and the other to those less.

The test circuit 10, since it couples with less than one milliampere current during testing, in no way can accidentally actuate detonator 12, the detonator requiring thousands of amperes to fire it. The magnetic coupling limits the power transferred either to or from the bridge circuit, effectively decoupling the monitor circuit from the rest of the system during firings. Thus, the continuity testing apparatus neither adds an extra hazard to the discharge circuitry, nor does it interfere with the actual firing. In fact, when the discharge circuitry is fired and capacitor C1 is discharged through switch 14 to actuate slapper detonator 12, the much lower storage capacity of capacitor C2 is merely discharged through high energy switch 14. It bypasses the slapper detonator 12. Thus, an improved electrical circuit continuity test apparatus has been provided which does not constitute a safety hazard, nor does it compromise the integrity of the firing unit.

What is claimed:

1. Electrical circuit continuity test apparatus for high-energy-discharge circuitry of a firing unit, such unit including high energy storage capacitor means connected to detonator means by a normally opened switch, said capacitor means, said switch, and said detonator means being electrically interconnected by a stripline transmission line having a pair of strip conductors separated by a thin dielectric, said apparatus comprising:

capacitor means bypassing said normally opened switch;

a test circuit including impedance sensing means and a high frequency signal source;

transformer means for coupling said test circuit to said stripline transmission line including a high permeability core in the form of a loop of high magnetic permeability material having thickness and width dimensions substantially of the same order of magnitude as a said strip conductor and inserted in a crosswise manner between a said strip conductor and said dielectric of said transmission line and including primary winding means wrapped around said loop and connected to said test circuit to couple said high frequency signal source to said high energy storage capacitor means and said bypass capacitor means whereby said sensing means may sense the impedance of said capacitor means and said transmission line.

2. Apparatus as in claim 1 where said impedance sensing means includes a resistance bridge having four branches, said signal source being connected across two of said branches and including comparator means connected across the other two of said branches and where one of said branches includes said primary winding means.

3. Apparatus as in claim 2, where another of said branches includes a reference capacitor.

4. Apparatus as in claim 1, where said primary winding means is a single turn whereby said transformer means has a one-to-one turns ratio.

5. Apparatus as in claim 1, where said high magnetic permeability material is an iron-base alloy with a high percentage of nickel.

* * * * *